(12) United States Patent
Wen

(10) Patent No.: US 8,694,874 B2
(45) Date of Patent: Apr. 8, 2014

(54) CIRCUIT AND METHOD FOR PARALLEL PERFORATION IN RATE MATCHING

(75) Inventor: Ziyu Wen, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 224 days.

(21) Appl. No.: 13/258,354

(22) PCT Filed: Jun. 29, 2010

(86) PCT No.: PCT/CN2010/074716
§ 371 (c)(1),
(2), (4) Date: Dec. 29, 2011

(87) PCT Pub. No.: WO2011/000308
PCT Pub. Date: Jan. 6, 2011

(65) Prior Publication Data
US 2012/0096238 A1    Apr. 19, 2012

(30) Foreign Application Priority Data
Jul. 1, 2009    (CN) .......................... 2009 1 0148724

(51) Int. Cl.
H03M 13/03    (2006.01)
(52) U.S. Cl.
USPC ........... 714/790; 714/752; 714/755; 714/758; 714/786
(58) Field of Classification Search
USPC .................... 714/752, 755, 758, 786, 790
See application file for complete search history.

(56) References Cited

U.S. PATENT DOCUMENTS

2008/0301536 A1 * 12/2008 Shin et al. ..................... 714/786
2009/0067378 A1    3/2009 Luo et al.

FOREIGN PATENT DOCUMENTS

| CN | 101217341 A | 7/2008 |
| WO | 2008151061 A1 | 12/2008 |
| WO | 2009032950 A2 | 3/2009 |

OTHER PUBLICATIONS

International Search Report on international application No. PCT/CN2010/074716, mailed on Oct. 8, 2010.
English Translation of the Written Opinion of the International Search Authority in international application No. PCT/CN2010/074716, mailed on Oct. 8, 2010.

* cited by examiner

*Primary Examiner* — Sam Rizk
(74) *Attorney, Agent, or Firm* — Oppedahl Patent Law Firm LLC

(57) ABSTRACT

A circuit and a method for parallel perforation in rate matching can adopt three selector arrays and three register groups. The first selector array is configured to remove null bits in input data and output the remaining data to the first register group; the second selector array is configured to combine the first register group and the third register group and then output the combined data to the second register group; during the combination, the valid data in the third register group are preferentially selected, and then the data in the first register group are selected; Further, the third selector array is configured to output remaining valid data in the first selector group to the third register group if the valid data in the first selector group are not used out while combining the first register group and the third register group by the second selector array.

8 Claims, 4 Drawing Sheets

CIRCUIT AND METHOD FOR PARALLEL PERFORATION IN RATE MATCHING

TECHNICAL FIELD

The present invention relates to a channel coding portion in the mobile communication system, in particular to a hardware circuit and method for parallel perforation in rate matching.

BACKGROUND

In a mobile communication system, after the data in the transmission layer are coded, the data flow in unit time is possibly different from the flow that the wireless port can bear, so rate matching is needed. The process of the rate matching is generally to interlace firstly, then combine multiple paths, and perforate or repeat. Generally speaking, null bits, also called dummy units, are introduced in the coding and rate matching. The purpose of the perforation is to remove the null bits.

A method generally used is to perform the rate matching by utilizing software or to perform single-bit serial processing by hardware. The single-bit serial processing by is hardware is as follows: reading one bit by one clock for the rate matching; if a bit is null during the perforation, not outputting the bit to a lower level; otherwise, outputting the bit to the lower level. It should not be a problem in a 3G (the Third Generation) system as the data flow in the 3G is not great, and the time delay can be relatively long. Thus, there will not be a bottleneck of the system.

In a Long Term Evolution (LTE) system, the data flow is very great, and the time delay is required to be very short. As for a system with the bandwidth of 20 MHz, in the case of 4*4 spatial multiplexing Multiple-Input Multiple-Output (MIMO), the flow of one cell will reach to 300 Mbps, and the flow of three cells will reach to 900 Mbps; and after the data are channel coded, the flow will triple. Moreover, in the LTE system, one Transmission Time Interval (TTI) is only 1 ms, and the time pre-remained for the rate matching is very little. In such case when using the conventional method, neither a single CPU nor a special hardware circuit can satisfy the requirements, and multiple CPUs or hardware circuits need to be used in parallel. As a result, the system cost rises sharply to form the bottleneck of the LTE system.

SUMMARY

The present invention provides a circuit and a method for parallel perforation in rate matching in order to avoid the rate matching from becoming the bottleneck of the LTE system.

In order to realize the above purpose, the technical solution of the present invention is realized in this way:

a circuit for parallel perforation in rate matching, the circuit comprises multiple selector arrays and corresponding multiple register groups;

each selector array comprises a start selector array, one or more combining selector arrays, and an end selector array; correspondingly, each register group comprises a start register group, one or more combining register groups, and an end register group, wherein input data are connected to a data input end of the start selector array; output of the start selector array is registered into the start register group; the start register group is connected to both a data input end of the combining selector array and a data input end of the end selector array; output of the end selector array is registered into the end register group; the end register group and the combining register group, after combined with each other, serve as the data input end of the combining selector array; output of the combining selector array is registered into the combining register group; and the data in the combining register group serve as output data.

The selector array may comprise a first selector array, a second selector array and a third selector array; and the register group may comprise a first register group, a second register group and a third register group; wherein the input data are connected to a data input end of the first selector array; output of the first selector array is registered into the first register group; the first register group is connected to both a data input end of the second selector array and a data input end of the third selector array; output of the third selector array is registered into the third register group; the third register group and the second register group, after combined with each other, serve as the data input end of the second selector array; output of the second selector array is registered into the second register group; and the data in the second register group serve as output data.

The first selector array may be configured to remove a null bit in the input data.

The second selector array may be configured to combine valid data in the first register group and valid data in the third register group respectively.

The second selector array may be configured to preferentially select the valid data in the third register group while combining the valid data in the first register group and the valid data in the third register group respectively.

The third selector array may be configured to output remaining valid data in the first is selector group to the third register group if the valid data in the first selector group are not used out while combining the valid data in the first register group and the third register group by the second selector array.

The circuit may further comprise selection control parts of the three selector arrays, and the outputs of the selection control parts serve as control ends of the three selector arrays to control the outputs of the three selector arrays.

The selection control part may comprise a first selection control part, a second selection control part and a third selection control part, wherein a null mark to which the input data corresponds are connected to input of the first selection control part; output of the first selection control part is simultaneously connected to a selection control input end of the first selector array, an input end of the third selection control part and an input end of the second selection control part; output of the third selection control part is connected to a selection control input end of the third selector array; and output of the second selection control part is connected to a selection control input end of the second selector array.

A method for parallel perforation in rate matching, being applicable in a scene involving three selector arrays and corresponding three register groups, wherein the selector arrays comprises a first selector array, a second selector array and a third selector array; the register groups comprises a first register group, a second register group and a third register group;

the method comprises the following steps:

step 1, selecting a number m of bits for parallel reading, wherein the sizes of the three register groups are respectively m, m, and m−1;

step 2, reading null marks to which the m bits corresponds;

step 3, determining a rearrangement sequence of input data based on the null marks to which the m bits corresponds;

step 4, rearranging the input data based on the rearrangement sequence, and writing the rearranged result into the first register group; and step 5, combining valid data in the second register group with valid data in the first register group, if there is no valid data in the third register group, and writing the combined valid data into the second register group; writing remaining part into the third register group if the second register group is full; combining the valid data in the third register group with the valid data in the first register group, if there are valid data in the third register group, and writing the combined valid data into the second register group; writing remaining part into the third register group if the second register group is full; and outputting all the data in the second register group when it is full.

The method of rearrangement may comprise: knocking off the data to which null corresponds, and moving ahead the data behind in turn;

performing step 2 to step 5 in series.

The data throughput in the LTE system is of a quite great amount, which is 10 to 20 times of that in a 3G system; the time delay requirement of corresponding data paths in the LTE system is very strict; in the conventional rate matching circuit, the perforation is performed as single bit serial perforation, therefore such a circuit is unable to process the large flow of data in the LTE system in time. If multiple sets of such circuits are used for parallel processing, the circuit consumption is very high to result in the sharp increase of the cost. Thus, the realization of the system is impracticable. The adoption of the perforation circuit and perforation method of the present invention, compared with the prior art, has the following advantages:

1. the present invention adopts parallel processing of multiple bits so as to reduce the processing time delay and overcome the disadvantage of long processing time in the prior art;

2. when multiple sets of single bit serial processing is adopted, the required capacity of the Random Access Memory (RAM) needed of each set of circuit is substantially equal to that of the circuit itself; if 8 bits parallel processing is adopted, the consumption of the RAM of the circuit itself will be about ⅛ of the original; in an Application Specific is Integrated Circuit (ASIC) or a Field-Programmable Gate Array (FPGA), the RAM occupies most area of the chip, so the key for the cost reduction is to reduce the area of the RAM; and 3. the conservation of the chip area also leads to the reduction of the power consumption; currently, not only the requirement for the power consumption of the terminal chip is very strict, but also the requirement for the power consumption of the system side becomes higher along with the continuous improvement of the system integrated level.

DETAILED DESCRIPTION

The present invention is further described below in detail with reference to the accompanying drawings and embodiments.

Figure 1:
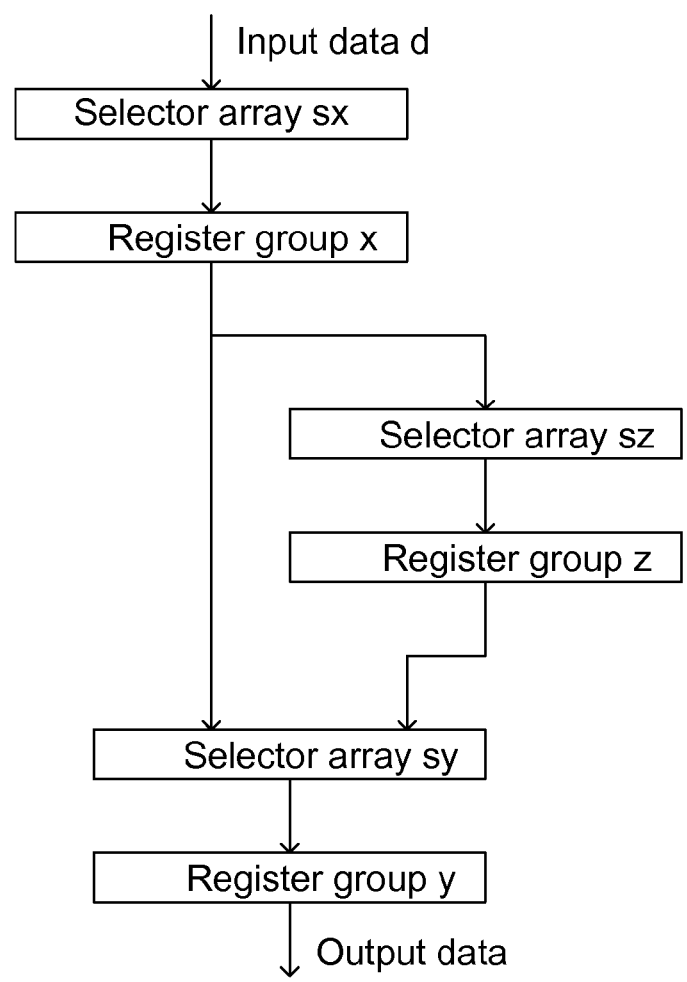
FIG. 1 shows a structural block diagram of a circuit data path according to the present invention.

FIG. 1 shows a structural block diagram of a circuit data path according to the present invention; as shown in the Figure, the circuit for parallel perforation in rate matching of the present invention comprises a first selector array sx, a first register group x, a second selector array sy, a second register group y, a third selector array sz, and a third register group z. The input data are connected to the data input end of the first selector array sx; and the output data are output by the second register group y.

The first selector array sx is configured to remove the null bits in the input data d; is and the first register group is configured to register the output of the first selector array sx. The second selector array sy is configured to combine the valid data in the first register group x and the third register group z respectively and outputs the combined data to the second register group. During the combination, the valid data in the third register group z are selected preferentially, and then the data in the first register group x are selected. The second register group y is configured to register the output of the second selector array sy. When the second selector array sy combines the first register group x and the third register group z, if the valid data in the x are not used out, the remaining valid data are transferred to the third selector array sz; and the third register group z is configured to register the output of the third selector array sz.

Figure 2:
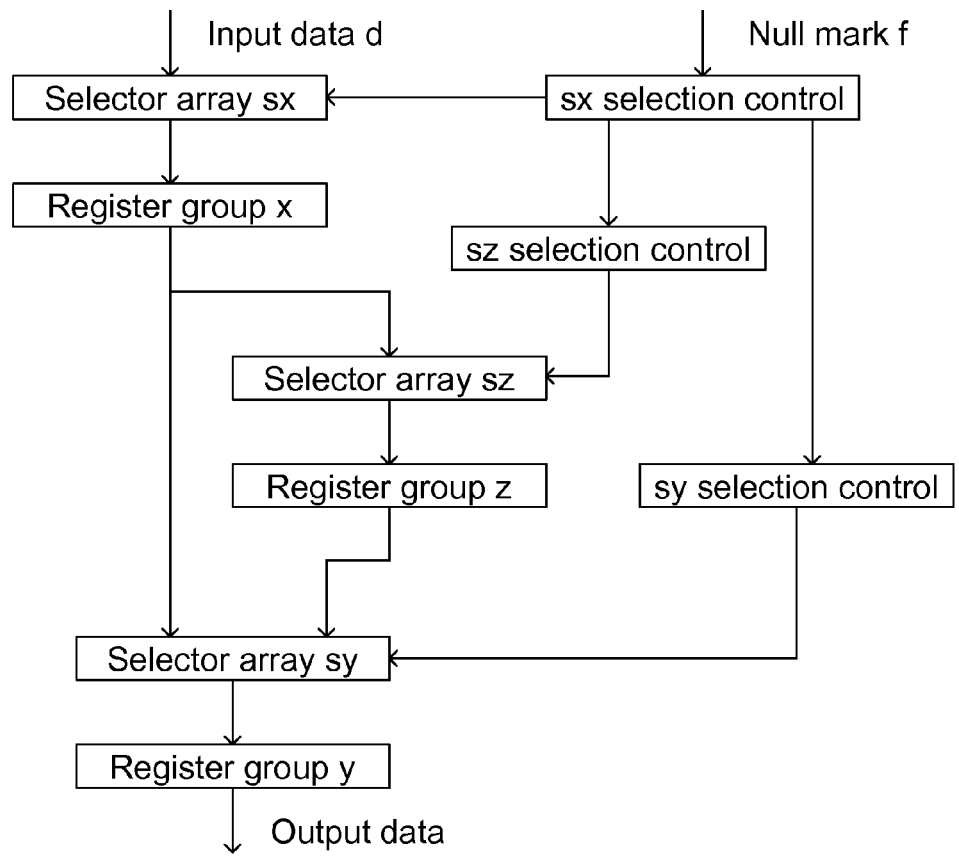
FIG. 2 shows a complete structural block diagram of the circuit according to the present invention.

The complete circuit including a control circuit is shown in FIG. 2, in which the circuits below are added on the basis of the circuit as shown in FIG. 1:

a first selection control, namely an sx selection control, a second selection control, namely an sy selection control, and a third selection control, namely an sz selection control.

Wherein, the input data d are connected to the data input end of the first selector array sx; the output of the first selector array sx is registered into the first register group x; the first register group x is connected to both the data input end of the second selector array sy and the data input end of the third selector array sz; the output of the third selector array sz is registered into the third register group z; the third register group z and the first register group x, after combined with each other, serve as the data input end of the second selector array sy; and the output of the second selector array sy is registered into the second register group y.

The null mark f to which the input data d corresponds are connected to the input of the sx selection control; the output of the sx selection control is simultaneously connected to the selection control input end of the first selector array sx, the input end of the sz selection control and the input end of the sy selection control; the output of the sz selection control is connected to the selection control input end of the third selector array sz; and the output of the sy selection control is connected to the selection control input end of the second selector array sy.

The sx selection control includes three counters as follows: cnt_x, cnt_y and cnt_z, which respectively represent the numbers of the valid data in the three register groups x, y and z. The ranges are respectively as follows: 0 to m, 0 to m−1 and 0 to m−1; and m is the number of bits for one parallel reading.

After the second register group y is full, the valid data are output to an outer part at once, and the number of the valid data therein is zero. Thus, the scope of the counter cnt_y is 0 to m−1 rather than 0 to m. When the second register group y is full, equivalently the second register group y is empty.

In a practical circuit, the sx selection control, the sy selection control and the sz selection control may be combined together to be one selection control to realize the selection control functions for the three selector arrays.

When there are data in the third register group z, the second register group y is empty. When there are data in the second register group y, the third register group z is empty. The second register group y is provided with an enabling port; the highest bit in the second register group y can be provided with no enabling end; if provided with the enabling end, it should be kept on enabling. The first register group x and the third register group z may be provided with no enabling port.

The hardware circuit of the present invention is further described below in detail by taking the eight-point parallel perforation as an example.

Figure 3:
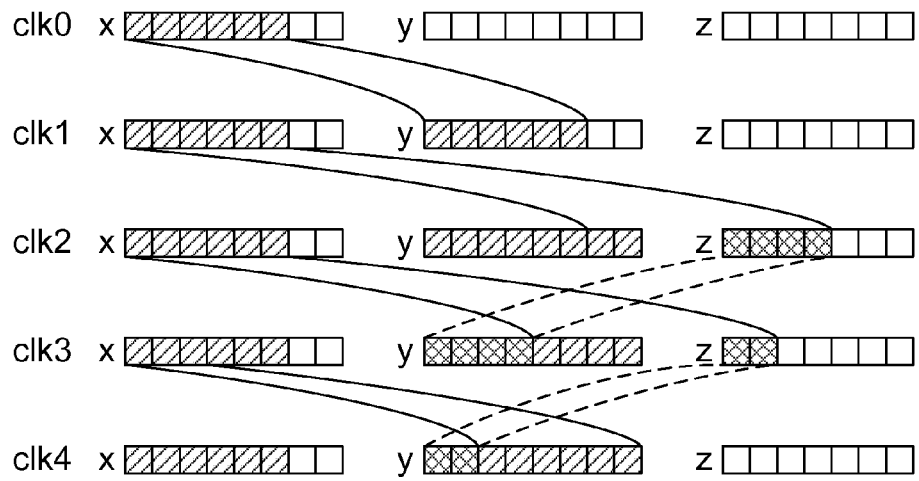
FIG. 3 shows a schematic diagram of the occupation of the first register group x/y/z during eight-point parallel perforation with two nulls at each time.

During the perforation process in the rate matching, the position of the hole is substantially random; and when eight points are read at a time for the perforation, the number of the holes in the eight points can be various. Providing there are two null bits in each eight points, there are six valid bits; after the perforation, the null bits are knocked off, and the remaining six bits are connected together. After the six bits of next time are combined with the six bits of last time, first eight bits are output, and four bits are remained. Then after further next six bits are combined with the four bits, first eight bits are still output, and two bits are remained. The procedures are shown in FIG. 3.

Figure 4:
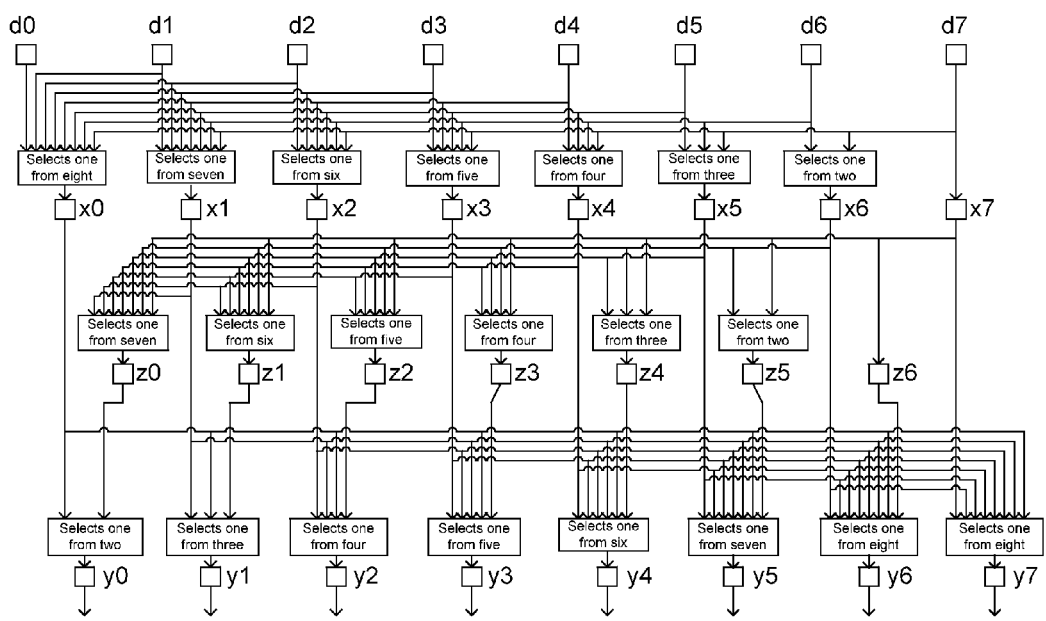
FIG. 4 shows a detailed circuit diagram of the data path for the eight-point parallel perforation according to an embodiment.

A detailed structure of a data path hardware circuit for realizing the eight-point parallel perforation is shown in FIG. 4.

The register group x includes eight registers respectively as x0/x1/ . . . /x7; the register group y includes eight registers respectively as y0/y1/ . . . /y7; and the register group z includes seven registers respectively as z0/z1/ . . . /z6.

The selector array sx includes seven selectors respectively as sx0/sx1/ . . . /sx6; the selector array sy includes eight selectors respectively as sy0/sy1/ . . . /sy7; and the selector array sz includes six selectors respectively as sz0/sz1/ . . . /sz5. The outputs of the sx0/sx1/ . . . /sx6 are respectively connected to the x0/x1/ . . . /x6; the outputs of the sy0/sy1/ . . . /sy7 are respectively connected to the y0/y1/ . . . /y7; and the outputs of the sz0/sz1/ . . . /sz5 are respectively connected to the z0/z1/ . . . /z5.

The sx0 selects one from eight, the sx1 selects one from seven, and so on, the sx6 selects one from two. The eight inputs of the sx0 is in sequence of d0/d1/ . . . /d7, the seven inputs of the sx1 is in sequence of d1/d2/ . . . /d7, and so on, the two inputs of the sx6 is in sequence of d6/d7, and the input of the x7 in the register group x is d7.

The sy0 selects one from two, the sy1 selects one from three, and so on, the sy6 selects one from eight, and the sy7 selects one from eight. The two inputs of the sy0 is in sequence of x0/z0, the three inputs of the sy1 is in sequence of x1/x0/z1, the four inputs of the sy2 is in sequence of x2/x1/x0/z2, and so on, the eight inputs of the sy6 is in sequence of x6/x5/x4/x3/x2/x1/x0/z6, and the eight inputs of the sy7 is in sequence of x7/x6/x5/x4/x3/x2/x1/x0.

The sz0 selects one from seven, the sz1 selects one from six, and so on, and the sz5 selects one from two. The seven inputs of the sz0 is in sequence of x1/x2/ . . . /x7, the six inputs of the sz1 is in sequence of x2/x3/ . . . /x7, and so on, the two inputs of the sz5 is in sequence of x6/x7, and the input of the z6 in the register group z is x7.

For the situation that the number of the null bits in the eight points is changeable, the circuit can adapt to all conditions, that is to say, the circuit can process in case of 0 to 8 null bits. If the range of the number of the null bits is not so large, the first selector array sx in the circuit can be suitably optimized to reduce the circuit consumption.

For the sx selection control, the control end of the first selector array sx is generated via priority code iteration.

For the sy selection control, the control end of the second selector array sy is generated by using the cnt_y and cnt_z.

For the sz selection control, the control end of the second selector array sy is generated by using the cnt_y.

Figure 5:
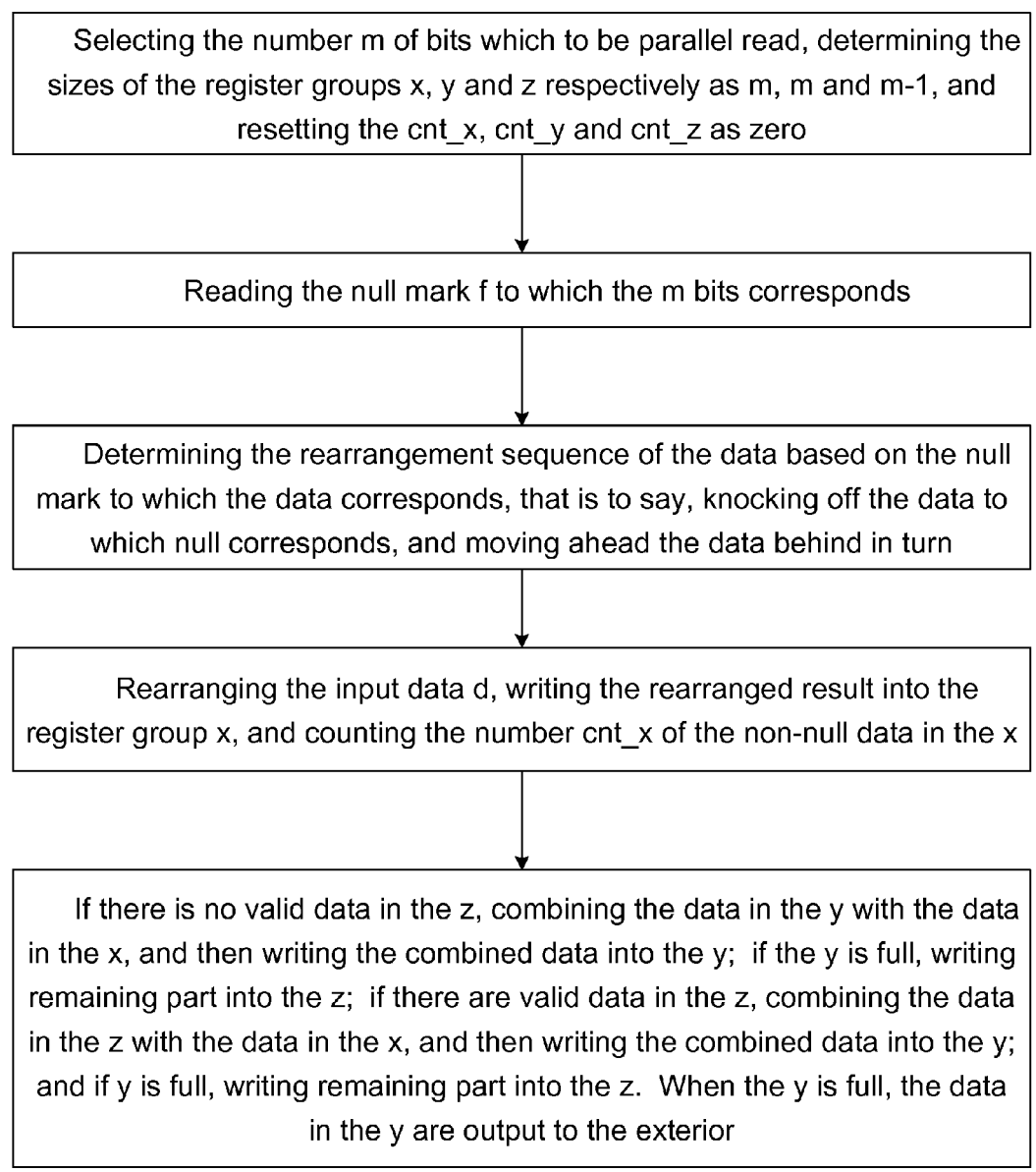
FIG. 5 shows a flowchart of a method according to the present invention.

FIG. 5 shows the flowchart of the method according to the present invention. As shown in FIG. 5, the method of the present invention specifically comprises steps as follows:

Step 1, processing rate matching according to that eight bits should be parallel read within one clock, determining the sizes of the three register groups x, y and z respectively as 8, 8 and 7, and resetting the cnt_x, cnt_y and cnt_z to zero;

Step 2, reading the null mark f to which the eight-bit data corresponds;

Step 3, determining the rearrangement sequence of the data based on the null marks to which the data corresponds, that is to say, knocking off the data to which the null corresponds, and moving ahead the data behind in turn;

Step 4, rearranging the input data d, writing the rearranged result into the first register group x, and counting the number cnt_x of the non-null data in the first register group x; and Step 5, if there is no valid data in the third register group z, combining the data in the second register group y with the data in the first register group x, and then writing the combined data into the second register group y; if the second register group y is full, writing remaining part into the third register group z; if there are valid data in the third register group z, combining the data in the third register group z with the data in the first register group x, and writing the combined data into the second register group y; and if is the second register group y is full, writing remaining part into the third register group z. When the second register group y is full, the data in the second register group y are output to the exterior.

Step 2 to step 5 are performed in series.

It should be noted that there also can be multiple selector arrays and register groups rather than three in the practical use, for example:

multiple selector arrays and corresponding multiple register groups are included, specifically comprises: a start selector array, one or more combining selector arrays, an end selector array; and a corresponding start register group, one or more combining register groups and an end register group; wherein the input data are connected to the data input end of the start selector array; the output of the start selector array is registered into the start register group; the start register group is connected to both the data input end of the combining selector array and the data input end of the end selector array; the output of the end selector array is registered into the end register group; the end register group and the combining register group, after combined with each other, serve as the data input end of the combining selector array; the output of the combining selector array is registered into the combining register group; and the data in the combining register group serve as the output data.

It should be understood that the detailed description for the specific embodiment is not the limitation of the protection scope of the patent of the present invention; and the patent protection scope of the present invention should be determined according to the appended claims.

The invention claimed is:

1. A circuit for parallel perforation in rate matching, the circuit comprising multiple selector arrays and corresponding multiple register groups; wherein each selector array comprises a start selector array, one or more combining selector arrays, and an end selector array; correspondingly, each register group comprises a start register group, one or more combining register groups, and an end register group; wherein input data are connected to a data input end of the start selector array; output of the start selector array is registered into the start register group; the start register group is connected to both a data input end of the combining selector array and a data input end of the end selector array; output of the end selector array is registered into the end register group; the end register group and the combining register group, after combined with each other, serve as the data input end of the combining selector array; output of the combining selector array is registered into the combining register group; and the data in the combining register group serve as output data, wherein the selector array comprises a first selector array, a second selector array and a third selector array; and the register group comprises a first register group, a second register group and a third register group; wherein the input data are connected to a data input end of the first selector array; output of the first selector array is registered into the first register group; the first register group is connected to both a data input end of the second selector array and a data input end of the third selector array; output of the third selector array is registered into the third register group; the third register group and the second register group, after combined with each other, serve as the data input end of the second selector array; output of the second selector array is registered into the second register group; and the data in the second register group serve as output data, wherein the first selector array is configured to remove a null bit in the input data.

2. The circuit according to claim 1, wherein the second selector array is configured to combine valid data in the first register group and valid data in the third register group respectively.

3. The circuit according to claim 2, wherein the second selector array is further configured to preferentially select the valid data in the third register group while combining the valid data in the first register group and the valid data in the third register group respectively.

4. The circuit according to claim 1, wherein the third selector array is configured to output remaining valid data in the first selector group to the third register group if the valid data in the first selector group are not used out while combining the valid data in the first register group and the third register group by the second selector array.

5. The circuit according to claim 1, wherein the circuit further comprises selection control parts of the three selector arrays, and outputs of the selection control parts serve as control ends of the three selector arrays to control the outputs of the three selector arrays.

6. The circuit according to claim 5, wherein the selection control parts comprises a first selection control part, a second selection control part and a third selection control part, wherein a null mark to which the input data corresponds are connected to input of the first selection control part; output of the first selection control part is simultaneously connected to a selection control input end of the first selector array, an input end of the third selection control part and an input end of the second selection control part; output of the third selection control part is connected to a selection control input end of the third selector array; and output of the second selection control part is connected to a selection control input end of the second selector array.

7. A method for parallel perforation in rate matching, being applicable in a scene involving three selector arrays and corresponding three register groups, wherein the selector arrays comprises a first selector array, a second selector array and a third selector array; the register groups comprises a first register group, a second register group and a third register group; and the method comprising the following steps:

step 1, selecting a number m of bits for parallel reading, wherein the sizes of the three register groups are respectively m, m, and m−1;

step 2, reading null marks to which the m bits corresponds;

step 3, determining a rearrangement sequence of input data based on the null marks to which the m bits corresponds;

step 4, rearranging the input data based on the rearrangement sequence, and writing the rearranged result into the first register group; and step 5, combining valid data in the second register group with valid data in the first register group, if there is no valid data in the third register group, and writing the combined valid data into the second register group; writing remaining part into the third register group if the second register group is full; combining the valid data in the third register group with the valid data in the first register group, if there are valid data in the third register group, and writing the combined valid data into the second register group; writing remaining part into the third register group if the second register group is full; and outputting all the data in the second register group when it is full.

8. The method according to claim 7, wherein the method of rearrangement comprises: knocking off the data to which null corresponds, and moving ahead the data behind in turn;

performing step 2 to step 5 in series.

* * * * *